United States Patent [19]

Gilbert

[11] 3,995,178

[45] Nov. 30, 1976

[54] PULSE-WIDTH AND FREQUENCY MODULATOR CIRCUIT

[75] Inventor: Roswell W. Gilbert, New York, N.Y.

[73] Assignee: Motor Finance Corporation, Dunellen, N.J.

[22] Filed: Oct. 31, 1975

[21] Appl. No.: 627,878

Related U.S. Application Data

[60] Division of Ser. No. 351,502, April 16, 1973, Pat. No. 3,944,852, which is a division of Ser. No. 210,456, Dec. 21, 1971, Pat. No. 3,746,851, and a continuation-in-part of Ser. No. 6,075, Jan. 27, 1970, Pat. No. 3,626,292, and a continuation-in-part of Ser. No. 184,026, Sept. 27, 1971, Pat. No. 3,745,557, which is a division of Ser. No. 6,075, Jan. 27, 1970.

[52] U.S. Cl. .............................. 307/271; 307/229; 328/127; 328/147; 332/9 T
[51] Int. Cl.$^2$ .......................................... H03K 1/16
[58] Field of Search ............... 307/229, 228, 235 F, 307/235 T, , 265, 271; 328/127, 146, 147, 58; 332/9 R, 9 T

[56] References Cited

UNITED STATES PATENTS

| | | | |
|---|---|---|---|
| 3,749,942 | 7/1973 | Moses | 307/235 T |
| 3,814,352 | 6/1974 | Grimes | 307/228 |
| 3,835,402 | 9/1974 | Kublick | 307/271 |
| 3,835,419 | 9/1974 | Milne et al. | 307/271 |

*Primary Examiner*—Stanley D. Miller, Jr.
*Assistant Examiner*—Marcus S. Rasco
*Attorney, Agent, or Firm*—Curtis, Morris & Safford

[57] ABSTRACT

A very accurate, low-offset switching circuit is provided. The switching circuit is used in a modulator which permits output pulses to be modulated in width and/or frequency. The reversible output signals of the switching circuit are added to the modulating input signal and the sum is integrated. A level detector changes the polarity of its output voltage whenever the output of the integrator reaches either of two fixed levels. The output of the level detector is used to drive the field-effect transistors to control the switching of the output of the differential amplifier.

9 Claims, 6 Drawing Figures

PULSE-WIDTH AND FREQUENCY MODULATOR CIRCUIT

This is a division of application Ser. No. 351,502, filed Apr. 16, 1973, now U.S. Pat. No. 3,944,852, which is a division of application Ser. No. 210,456, filed Dec. 21, 1971, now U.S. Pat. No. 3,746,851, issued July 17, 1973, and a continuation-in-part of Ser. No. 6075, filed Jan. 27, 1970, now U.S. Pat. No. 3,626,292, and a continuation-in-part of Ser. No. 184,026, filed Sept. 27, 1971, now U.S. Pat. No. 3,745,557, which is a division of Ser. No. 6075 of Jan. 27, 1970.

This invention relates to switching devices, and particularly to devices for providing rapid output switching of an amplifier, particularly a differential amplifier. The invention further relates to pulse-width modulators, pulse-height modulators, and to multipliers, dividers and wattmeters and methods.

There are many needs for rapid switching devices, and particularly for devices which reverse the polarity of a signal rapidly. It is an object of the invention to produce such a device which is simple and relatively inexpensive, and yet is highly accurate for use in precision instrumentation.

There also is a need for very accurate, stable and reliable multipliers, dividers and wattmeters. In particular, the lack of wattmeters having sufficient accuracy is believed to cost the electrical power distribution industry in the United States a very substantial amount of money each year. Although many uses easily could be found for electronic wattmeters, the lack of sufficient accuracy, the high cost, and other factors have limited the usefulness of prior electric wattmeters.

In accordance with the foregoing, it is another object of the present invention to provide a highly accurate and relatively inexpensive and reliable multiplier, divider, and wattmeter, and methods of use. It also is desired to provide unique modulators which are capable of pulse-width, pulse-height and frequency modulation. It is another object to provide such devices which make advantageous use of the switching circuit of the invention.

In accordance with the present invention, the foregoing objects are met by the provision of a switching device including a high-gain differential amplifier with first and second input terminals. An impedance is connected between one of the input terminals and a third terminal for receiving the input signal to the circuit. Switching means are provided for switching the second terminal back and forth between the third terminal and a fourth terminal to change the polarity of the difference between the input signals on the input terminals to the differential amplifier, thus causing the output of the device to switch.

The modulator of the invention includes source means (preferably a switching device as described above) for producing an output signal alternating between two levels in response to input switching signals. The output of the source means is added to the modulating input signal, and that sum is integrated by an integrator. A level detector detects the output of the integrator and produces an output signal change whenever the integrator output reaches either of two different pre-determined levels. The output of the level detector is fed back as an input signal to the source means. This modulator provides pulse-width modulation, as well as frequency modulation. A pulse-height modulator (preferably using another of the switching devices) operates on the output of the pulse-width modulator to provide a multiplier device. By making one of the input signals to the multiplier proportional to a load current, and the other input proportional to a load voltage, the device can be used as a high-precision electronic wattmeter. The same device also can be used as a divider by maintaining one of the inputs constant while allowing the source level to vary, together with one of the inputs. The same device can be used as another type of frequency modulator by connecting the output of the pulse-height modulator back to the level detector to modify the levels at which integrator output signals are detected.

The foregoing and other objects and advantages of the invention will be pointed out or apparent from the following description and drawings.

In the drawings:

FIG. 1 is a schematic circuit diagram of a switching device constructed in accordance with the present invention;

Each of FIGS. 2 and 3 is an equivalent circuit diagram of the circuit shown in FIG. 1, each in a different switching condition;

SWITCHING CIRCUIT DEVICE

Figure 1:
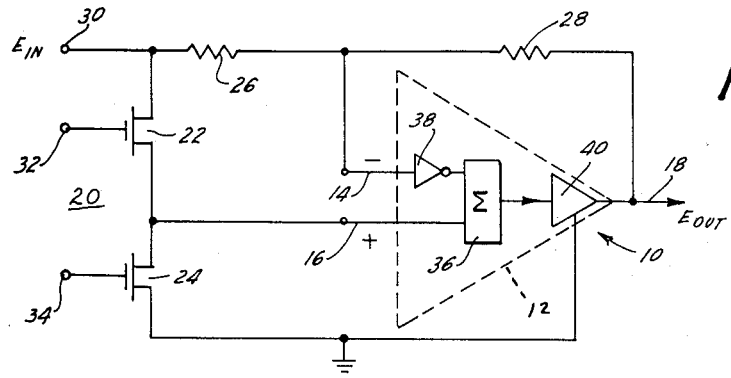

FIG. 1 shows a switching circuit device 10 constructed in accordance with the present invention. The device 10 includes an integrated operational differential amplifier 12, which is shown in dashed outline. The differential operational amplifier 12 has a non-inverting input lead 16, an inverting lead 14, and an output lead 18. A negative feed-back resistor 28 is connected between the output lead 18 and the inverting input lead 14 to form a high-gain differential amplifier.

Connected to the inverting lead 14 is a resistor 26 whose other end is connected to an input terminal 30. A gating circuit 20 is provided. The gating circuit includes two field-effect transistors ("FETs") 22 and 24. The source-drain path of the FET 22 is connected between the input terminal 30 and the non-inverting lead 16 of of the differential amplifier. The source-drain path of the FET 24 is connected between the non-inverting lead 16 and the common point in the circuit, e.g., ground. The gate leads 32 and 34 of the two FETs are connected to one or more switching sources (not shown in FIG. 1) which will operate to turn on one of the FETs while the other FET is turned off.

The operational differential amplifier 12 is of the conventional integrated type. This amplifier 12 includes a summing circuit 36 which receives the input from the non-inverting lead 16. The summing circuit 36 also receives an inverted input signal from the inverting lead 14 through an inverter 38. The output of the summing circuit is delivered to an amplifier 40 whose output lead is the output lead 18 of the differential amplifier.

Figure 2:
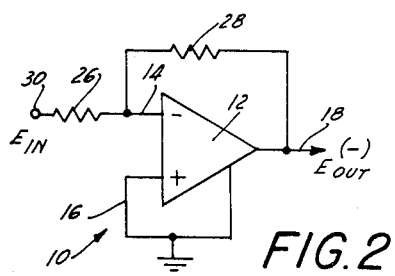

FIG. 2 shows the effective connection of the FIG. 1 circuit in the "inverting" mode; that is, in the mode in which FET 24 is turned on and FET 22 is turned off. The non-inverting lead 16 is connected to ground, and the inverting lead 14 is connected through resistor 26 to the input terminal 30. The relationship between the input voltage $E_{IN}$ applied at terminal 30 and the output voltage $E_{OUT}$ at terminal 18 is given by the following equation:

$$E_{OUT} = -E_{IN} (R_{28}/R_{26}) \qquad (1)$$

in which $R_{28}$ is the resistance of resistor 28, and $R_{26}$ is the resistance of resistor 26.

It can be seen from the foregoing equation that when $R_{26}$ equals $R_{28}$, the circuit 10 merely is a unity-gain inverter.

Figure 3:
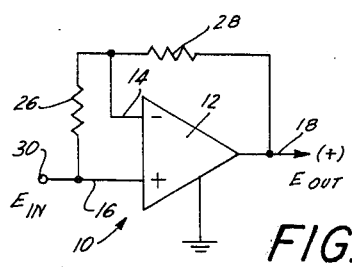

FIG. 3 shows the circuit 10 in the other of its two switching modes, the non-inverting mode. In this mode, the FET 22 is turned on and FET 24 is turned off. Thus, the non-inverting terminal 16 now is connected to the input signal terminal 30 instead of to ground. The full input voltage is applied to the non-inverting terminal 16, while the voltage drop across the resistor 26 is applied (together with a negative feed-back signal through resistor 28) to the inverting terminal 14 of the differential amplifier. The result of this connection is that initially a differential voltage appears between the terminals 14 and 16 due to the operation of the gating circuit 20. This differential lasts only during the very brief switching time of the amplifier output. In the ensuing steady-state condition, the signal on terminal 16 equals that on terminal 14 when output 18 is equal to input 30 and no current flows through resistors 26 and 28. Therefore, the output of FIG. 1 is non-inverted; that is, if the input signal is positive, the output signal is positive and equal, and vice versa. Thus, the polarity of the output signal has reversed.

The circuit shown in FIG. 3 is merely a follower type of circuit. Thus, the relationship between the output and input voltages is independent of resistors 26 and 28, and is expressed by the following equation:

$$E_{OUT} = E_{IN} \qquad (2)$$

In the FIG. 3 circuit, the values of resistors 26 and a28 can vary widely without changing the output signal in any significant degree because the amplifier inputs 14 and 16 have a relatively high impedance, and no current flows through the resistors.

The switching circuit shown in FIG. 1 has a number of advantages, particularly in electrical instrumentation. The device 10 provides an output signal which switches as fast as the operational amplifier 12 will permit, and this can be in the order of a few nanoseconds. The switching also can be accurate because the circuitry does little if anything to degrade the inherently good accuracy of the operational amplifier. For example, the series "on" resistances of the FETs 22 and 24 do not adversely affect the accuracy because the "off" resistance is millions of times greater than the "on" resistance.

The circuit device 10 has a substantial cost advantage over circuits previously used in instrumentation for similar purposes. For example, a typical prior art device is shown in the article entitled "An Electronic Multiplier for Accurate Power Measurements", by Tomota, Sugiyama and Yamaguchi, in "IEEE Transactions on Instrumentation and Measurement", Volume IM-17, No. 4, December, 1968. In such a prior art device, two separate precision voltage sources are used, with the outputs of each being sampled alternately by series FETs. An output operational differential amplifier is used as a buffer. As compared with applicant's circuit, such a prior circuit requires one additional precise voltage source that is not required by applicant's device. Thus, applicant's device is less expensive. Furthermore, the series "on" resistances of the FETs and the extra voltage source are sources of potential error which are not present in the present invention.

Other prior circuits have used a single precise voltage source, series FETs for switching, an inverting operational amplifier, and an output operational amplifier as a buffer. Such circuits also are inherently more costly and error-prone than applicant's circuit because they require one additional precise operational amplifier. Furthermore, the series FETs and extra operational amplifier are extra sources of error.

MODULATORS

Figure 4:
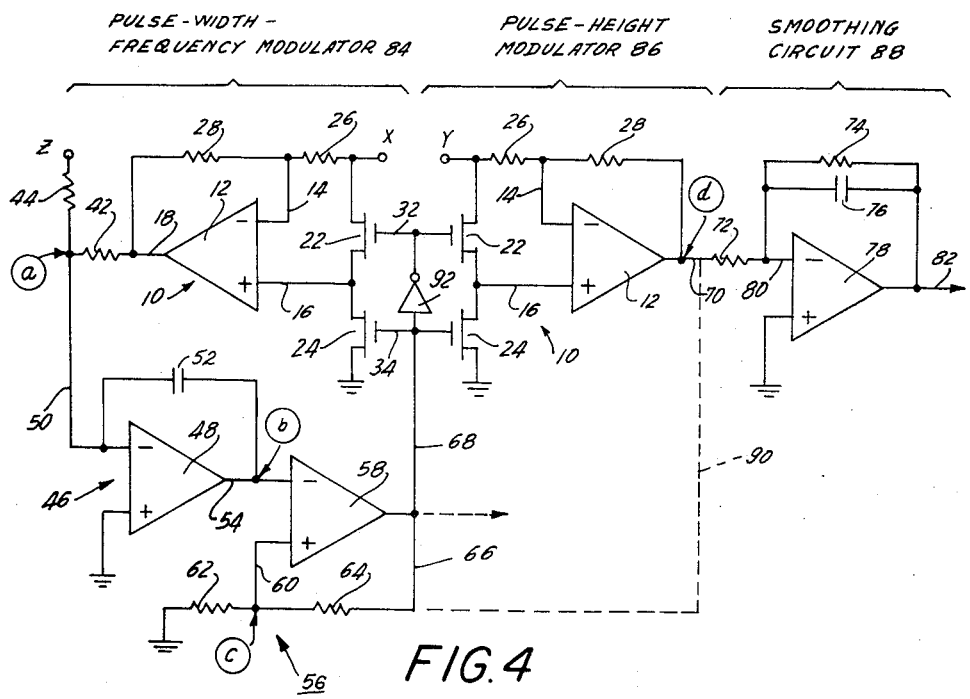
FIG. 4 is a schematic circuit diagram of a pulse-width-frequency modulator, pulse-height modulator, multiplier, divider and wattmeter device constructed in accordance with the present invention.

FIG. 4 simultaneously shows a number of different circuits using the switching device 10. The first of these circuits is a modulator 84 which is shown in the left hand portion of FIG. 4. The modulator 84 provides an alternating output pulse signal whose width and frequency are modulated by an input signal applied at a input terminal Z or, at a terminal X corresponding to the terminal 30 shown in FIGS. 1, 2 and 3.

The modulator 84 includes the switching device 10 which delivers its output through a resistor 42 to a node (a). An input signal is applied at terminal Z to the node (a) through a resistor 44, and is added to the output of the switching circuit. The sum of the two signals is supplied over a lead 50 to an integrating circuit 46. The output of the integrator 46 is delivered to a comparator or level-detector circuit 56. The output of circuit 56 is delivered through a lead 68 to the gate leads 32 and 34 of FETs 22 and 24 of the switching device 10.

Figure 5:
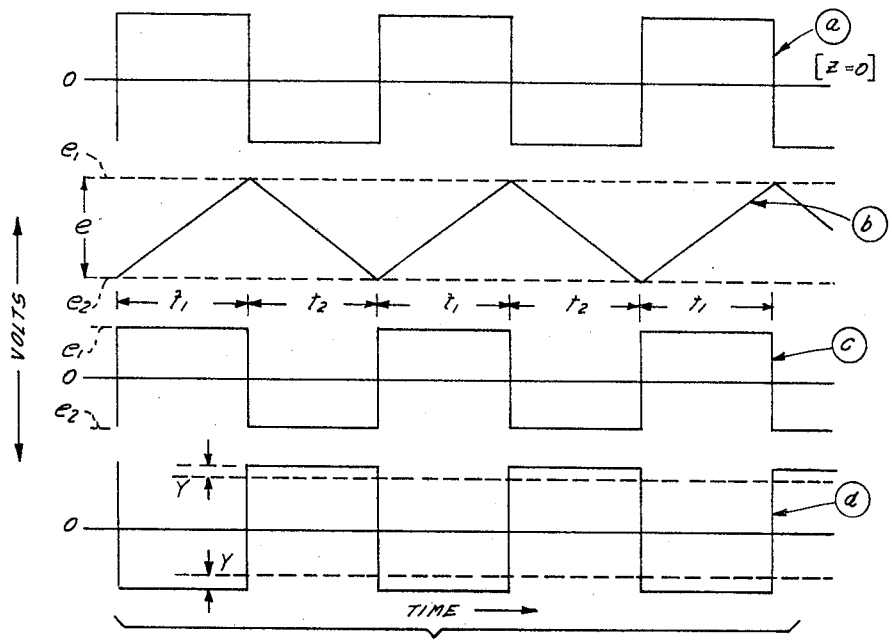
FIG. 5 shows waveform diagrams for various electrical signals in the circuit shown in FIG. 4.

The operation of the modulator 84 now will be explained with the assistance of FIGS. 5 and 6. FIG. 5 shows the waveforms of the signals appearing at points (a), (b), and (c) of FIG. 4, for the condition in which the signal applied to terminal Z is zero, and the signal applied to terminal X is a steady DC signal. The rectangular wave (a) shown in FIG. 5 is integrated by the integrator 46, which produces an output whose waveform is substantially triangular, as is shown at (b) in FIG. 5. The reason for this is that as the output voltage from the integrator reaches a first level $e_1$, the comparator causes its output voltage (c) to reverse polarity abruptly. This causes the switching circuit 10 to operate to reverse the polarity of its output and start the output of integrator 46 declining in a linear fashion. When the integrator output reaches a second level $e_2$, which is equal but opposite in polarity to the level $e_1$, the comparator again causes its output voltage to reverse polarity, again causing the switching circuit 10 to operate, thus starting the cycle once again.

Figure 6:
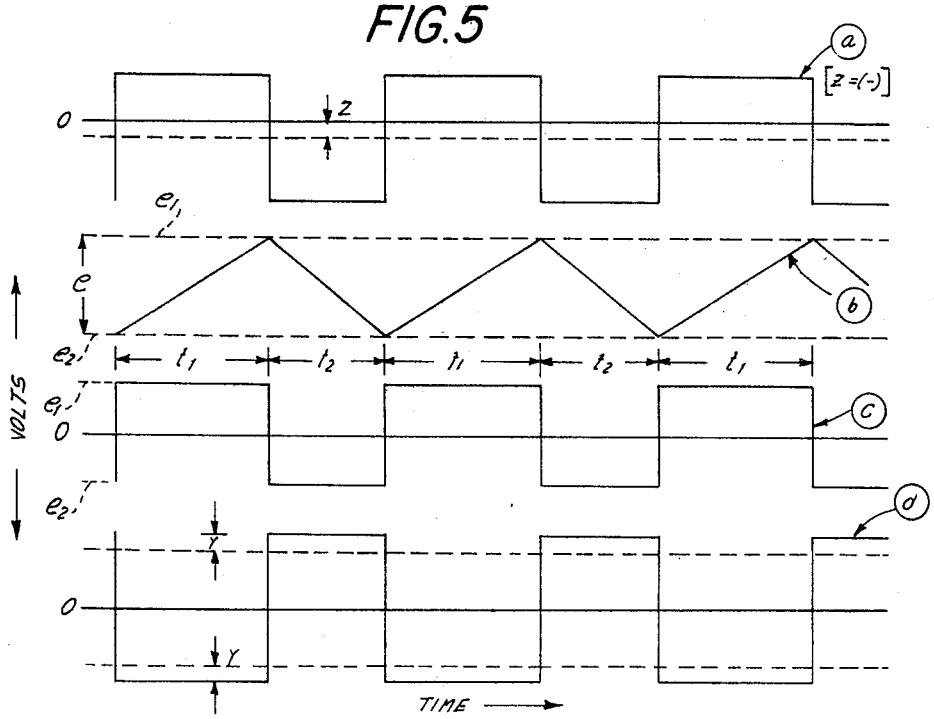
FIG. 6 shows the same waveforms as in FIG. 5, except that certain input signal parameters have been changed.

FIG. 6 illustrate how the above-described waveforms are changed when a negative DC signal is applied to terminal Z. First, the whole waveform (a) is shifted downwardly, meaning that the positive portions are of lower magnitude and the negative portions are of greater magnitude. Thus, the slope of the positive-going portions of the waveform (b) is lower. However, since the negative portions of the waveform (a) are of greater magnitude than before, the slope of the negative-going portions of the waveform (b) is steeper. Since the separation $e$ between comparator levels $e_1$ and $e_2$ is constant, the time duration $t_1$ of the positive-going portions of the integrator output is greater than the time duration $t_2$ of the negative-going portions of the wave. This is in contrast to the waveform (b) shown in FIG. 5, in which $t_1$ is equal to $t_2$.

The waveform (c) in FIG. 6 shows the result of this change on the output of the modulator. The positive pulses have the time duration $t_1$, and the negative pulses have the duration $t_2$. Thus, the widths of the pulses have been modulated by the signal applied to terminal Z. In addition, as will be more readily apparent from the equations set forth below, the frequency of the waveform (b) also has been changed by the application of the input signal. Thus, the modulator 84 is both a pulse-width modulator and a frequency modulator.

The following equations describe the operation of the modulator:

$$t_1 = e\, C/(I_z + I_x) \tag{3}$$

$$t_2 = -e\, C/(I_z - I_x) \tag{4}$$

$$I_z/I_x = \frac{t_1 - t_2\,(R_{26}/R_{28})}{t_1 + t_2} \tag{5}$$

$$I_z/I_x = \frac{t_1 - t_2}{t_1 + t_2}\ (\text{if } R_{28} = R_{26}) \tag{6}$$

$$I_z/I_x = \frac{t_1}{t_1 + t_2}\ (\text{if } R_{26} = \text{is infinitely large}) \tag{7}$$

$$f = 1/(t_1 + t_2) = (I_x^2 - I_z^2)/(2I_x eC) \tag{8}$$

In which: $t_1$, $t_2$ and $e$ are defined above and in FIGS. 5 and 6.

C is the integrating capacitance, the capacitance of capacitor 52.

$I_z$ is the current input to terminal Z.

$I_x$ is the current input to terminal X.

$R_{26}$ and $R_{28}$ are the resistances of resistors 26 and 28, respectively.

$f$ is the frequency of the output of the modulator; i.e., the frequency of the waveform (b) in FIGS. 5 and 6.

The modulator 84 also can be considered to be a free-running oscillator whose output frequency $f$ varies inversely with the magnitude of the Z signal, and directly with the X signal. Equation [8] shows this variation.

The foregoing equations also demonstrate the effect of the input signal on terminal X in the width modulation of the output signal. Thus, both the X and Z inputs are capable of modulating the pulse width and frequency of the output.

Integrator 46 is a conventional high-precision integrator circuit. It includes an operational differential amplifier 48 and a negative feedback capacitor 52. The input signal is applied to the inverting terminal, and the non-inverting terminal is grounded. The value of the capacitance C of the capacitor 52 is set so that, in accordance with equation [8] above, the frequency will be within the desired range. For steady DC inputs, the frequency $f$ is not particularly critical. However, for AC or fluctuating DC inputs, the frequency $f$ should be high enough to ensure that a very small sample of the input wave is taken during each cycle of modulator operation. For precision measurements, $f$ should be over 100 times the frequency of the input wave, and preferably is at least 200 times the latter frequency.

The comparator circuit 56 consists of another operational differential amplifier 58 with a resistor network connected to the non-inverting input lead 60 of the amplifier 58. The inverting input lead receives the output from the integrator circuit 46. The resistor network consists of resistors 62 and 64 and is connected with the non-inverting input 60 and the output of the amplifier 58 in order to provide positive feedback.

In operation, the comparator produces a large (e.g. 10 volts) DC output signal of one polarity when the signals applied to the input terminals are different from one another in one direction, and a DC signal of equal magnitude but the opposite polarity when the input voltage difference is in the opposite direction. The ratio of the resistance of resistor 64 to the resistance of resistor 62 sets the value of the voltages or "break points" $e_1$ and $e_2$ (FIGS. 5 and 6) at which the signals on the input leads of the amplifier 58 equal one another. In essence, the circuit 56 can be thought of as a level detector, since it produces a change in the output signal whenever the input reaches a predetermined, fixed level. In this context, the circuit 56 also can be thought of as a level-sensitive flip-flop circuit.

In applying the output of the comparator 56 to the FETs 22 and 24, an inverter 92 is connected between the leads 32 and 34. This is because the FETs 22 and 24 are of the same channel type; that is, both FETs are of either the N-channel or P-channel type. The inverter 92 ensures that the gate of one FET always will receive a signal of a polarity opposite to that received by the other gate. If FETs of opposite channel type are used, that is, if one FET is of the N-channel type and the other of the P-channel type, the inverter can be omitted and replaced by an ordinary conductor.

PULSE-HEIGHT MODULATOR

The middle portion 86 of the circuit shown in FIG. 4 is a pulse-height modulator. Actually, the modulator is nothing more than a switching device 10 as is shown in FIGS. 1, 2 and 3, with an input terminal Y corresponding to the terminal 30 to receive the modulating input. Pulses from the comparator 56 are applied to the input gate leads 32 and 34 in the manner described above. The curve (d) in each of FIGS. 5 and 6 shows how the height of the pulses has been increased by the signal Y. It is readily apparent from equations [1] and [2] how this pulse-height modulation is accomplished.

MULTIPLE-INPUT FREQUENCY MODULATOR

A different frequency modulator can be produced by simply re-arranging the circuitry of the modulators 84 and 86 already described. In this embodiment of the invention, the connection 66 coupling the resistor 64 to the output of amplifier 58 is removed. Also, the output lead 70 of the pulse-height modulator 86 is connected by means of a lead 90 (shown as a dashed line) to the right end of resistor 64. Further, there is no input on the Z terminal.

With this arrangement, the output of the pulse-height modulator 86 is used to vary the separation $e$ of the breakpoints $e_1$ and $e_2$ of the comparator circuit 56. This provides a further means of changing the frequency f of the output signal at point (c) in FIG. 4. Equation [8] above shows the effect of such a change of the quantity e on the frequency f of the output wave. The following equation describes the simple relationship between the inputs at terminals X and Y in the circuit here being described:

$$f = I_X/I_Y \qquad (9)$$

In which $I_Y$ is the current input at terminal Y, and $I_X$ is defined above.

It is readily evident that this circuit has valuable utility as a voltage-to-frequency convertor, and specifically as a dividing circuit with an output in terms of frequency. This can be very valuable in analog-to-digital conversion.

MULTIPLIER, WATTMETER AND DIVIDER CIRCUIT

The entire circuit shown in FIG. 4 forms a high-precision multiplier, wattmeter and divider circuit. The circuit includes the modulators 84 and 86 described above, together with a smoothing circuit 88 which smooths the output from the pulse-height modulator 86 to produce a DC signal on the output lead 82 which is proportional to the product or division of two input signals.

The smoothing circuit 88 includes an input resistor 72, a differential operational amplifier 78, and a negative feed-back network consisting of parallel-connected resistor 74 and capacitor 76. The input signal is received on the inverting terminal 80. In essence, the smoothing circuit 88 is a low-pass filter.

MULTIPLICATION, POWER MEASUREMENT AND DIVIDING METHODS

The mode of operation of the circuit shown in FIG. 4 depends upon the method by means of which it is used. The general equation of the circuit is set forth below:

$$I_{OUT} = I_Z I_Y/I_X \qquad (10)$$

In which $I_{OUT}$ is the output current from terminal 82, and the other quantities have been defined above.

The circuit can be used as a multiplier by holding the signal input at terminal X constant, and allowing the signals applied to terminals Y and Z to be the input variables. When this is done, it can be seen from equation [10] that the output is simply the product of the inputs at terminals Z and Y.

When the device is used as a wattmeter, it is used as a multiplier; one of the input signals at Y or Z is made equal to the load current of the power being measured, and the other input is made equal to the load voltage. The output then is the product of the load current and voltage; i.e., the load power.

In use as a dividing circuit, either of the input signals on terminals Z and Y is held constant while the signals on terminal X and the other one of the terminals Z and Y is allowed to vary. It can be seen from equation [10] above that the output is proportional to the result of dividing either the Z or the Y signal by the X signal.

The circuits described above have a number of advantages, particularly in precision instrumentation. It is believed that the invention provides a multiplier, divider and wattmeter which, in practical use, is significantly more accurate than devices previously available. Furthermore, this greater accuracy is obtained with a substantial reduction in the number of components, and particularly in the number of expensive precision operational amplifiers required in previous circuits. Also, the device can be fast-operating (depending upon the cost one is willing to pay for the operational amplifiers), and is very reliable in operation.

The invention is particularly useful and unexpectedly accurate when operating with time-varying input signals whose waveform is relatively steep at low voltages and relatively flat at higher voltages. Typical of such a waveform is a sine wave, which has the greatest slope at zero volts and the lowest slope at its peaks. As noted above, typically, the frequency f at which the circuit operates is at least 100, and preferably 200 times the frequency of the Z input signal. The reason for the desirability of such frequent sampling is that it ensures that each portion of the input wave most closely approximates a DC signal. Since accuracy is reduced if this approximation is not carefully maintained, it is desired to have a relatively high operating frequency in areas in which the waveform has a steep slope and tends to degrade the approximation, whereas, a lower operating frequency will be sufficient where the waveform is relatively level and is close to being DC anyway. In the present invention, the frequency f of the operation of the circuit automatically is highest with the lowest input signals. In fact, when the input signal Z is zero, the highest frequency f occurs, and when the highest input signal occurs (Z must be lower than X), the lowest frequency results. Thus, it is an unexpected advantage of the circuit that it automatically operates with such waveforms in the most precise manner.

Following is a list of components which have been used in a circuit as shown in FIG. 4 which has been built and successfully operated. It should be noted that the components for the switching circuit 10 are included in this list.

| Component | |
|---|---|
| Operational Amplifiers 12, 48, 58 and 78 and Inverter 92 | The Model 44 Operational Amplifier sold by Analog Devices Corp.; a fast-settling operational differential amplifier. Switching time: 100 nanoseconds. Amplitude precision: 2 parts per million. |
| FETs 22 and 24 | 3N153 (N-channel depletion type) |
| Resistors 26 and 28 | 2,000 ohms (matched precisely) |
| Resistor 42 | 1,000 ohms |
| Resistors 62, 64 and 72 | 10,000 ohms |
| Resistor 44 | 2,000 ohms |
| Resistor 74 | 5,000 ohms |
| Capacitor 52 | .02 microfarads (precise for voltage/frequency converter) |
| Capacitor 76 | 2 microfarads |

The above description of the invention is intended to be illustrative and not limiting. Various changes or modifications in the embodiments described may occur to those skilled in the art and these can be made without departing from the spirit or scope of the invention.

I claim:

1. An electrical signal modulator comprising source means for producing an output signal alternating between two levels in response to input switching signals, said source means including a high-gain differential amplifier having two input terminals and an output terminal, and means for reversing the polarity of the output signal on said output terminal in response to a change in polarity of the difference between the input signals on said input terminals, an impedance connected between a first one of said input terminals and a third signal-receiving terminal, a fourth terminal for receiving a reference signal, and switching means for connecting the second of said input terminals alternately to said third terminal and said fourth terminal, means for receiving at least one modulating signal and changing at least one of said levels in response, integrator means for integrating the output of said source means, level detector means for detecting the output of said integrator means and producing an output signal change whenever the integrator output reaches either of two different predetermined levels, and means for transmitting the output of said level detector means to said source means as input switching signals to said source means.

2. A modulator as in claim 1 in which said levels of said level detector means are fixed and independent from said modulating input signal.

3. A modulator as in claim 1 in which said level detector means comprises an operational amplifier receiving the integrator output on its inverting terminal, bias means connected to the non-inverting terminal of said amplifier, and a positive feed-back resistor connected with said non-inverting terminal and the output of said amplifier.

4. A modulator as in claim 1 including a node between the output of said source means and the input of said integrator means, and means for conducting said modulating input signal into said node.

5. A modulator as in claim 1 including a reference source connected to said third terminal.

6. A modulator as in claim 5 in which said switching means includes a pair of field-effect transistors, one connected between said second and third terminals, and the other connected between said second and fourth terminals, and means for conducting the level detector output to the gate leads of said transistors with a polarity such that one transistor is turned on while the other is turned off.

7. A modulator as in claim 1 in which the frequency of the output of said level detector means is at least 100 times the frequency of said modulating signal.

8. A modulator as in claim 1 including means for changing at least one of said levels of said level detector means in response to another modulating input signal, thereby changing the frequency of the output of said level detector as a function of said other modulating input signal.

9. A modulator as in claim 8 in which said level detector means includes an operational amplifier receiving the integrator output on its inverting terminal, positive feed-back means connected to the non-inverting terminal of said amplifier, and in which said level-changing means includes means for feeding back to said bias means a signal synchronized with said output of said level detector.

* * * * *